Figure 1:
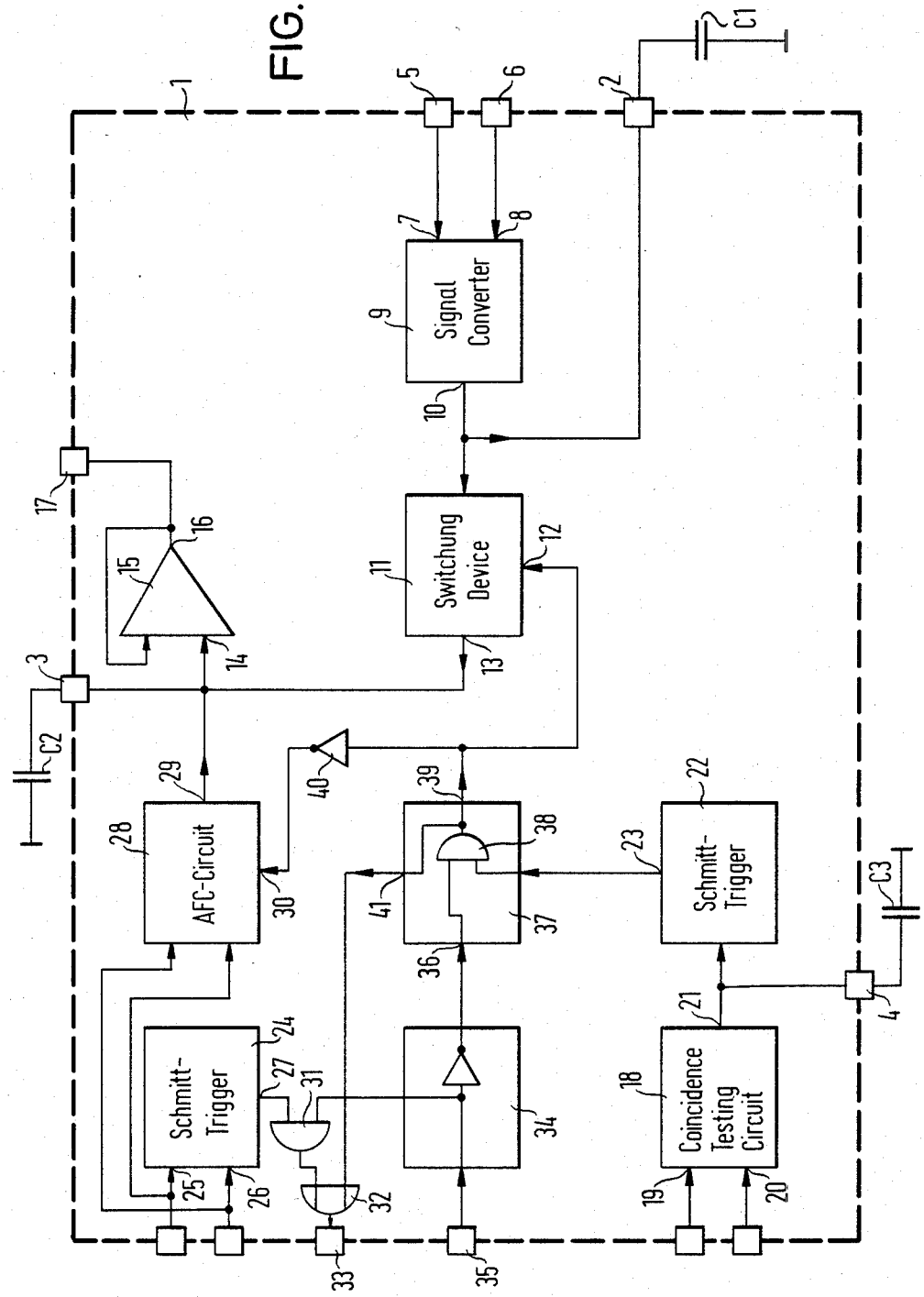

United States Patent [19]

Götz

[11] Patent Number: 4,511,923

[45] Date of Patent: Apr. 16, 1985

[54] METHOD FOR TUNING THE INPUT STAGE OF A RECEIVER TO A DESIRED RECEIVING FREQUENCY AND CIRCUIT ARRANGEMENT FOR CARRYING OUT THE METHOD

[75] Inventor: Laslo Götz, Freising, Fed. Rep. of Germany

[73] Assignee: Texas Instruments Incorporated, Dallas, Tex.

[21] Appl. No.: 320,896

[22] Filed: Nov. 12, 1981

[30] Foreign Application Priority Data

Nov. 14, 1980 [DE] Fed. Rep. of Germany ....... 3043103
Nov. 20, 1980 [DE] Fed. Rep. of Germany ....... 3043768

[51] Int. Cl.$^3$ ............................................. H04N 5/44
[52] U.S. Cl. .................... 358/191.1; 455/186
[58] Field of Search .................... 358/191.1; 455/161, 455/166, 185, 186

[56] References Cited

U.S. PATENT DOCUMENTS

| | | |
|---|---|---|
| 4,004,231 | 1/1977 | Elshuber et al. . |
| 4,031,549 | 6/1977 | Rast et al. . |
| 4,159,487 | 6/1979 | Elshuber et al. . |
| 4,198,605 | 4/1980 | Yamashita et al. ................. 455/161 |
| 4,200,841 | 4/1980 | Nagata et al. . |
| 4,291,414 | 9/1981 | Kimura .............................. 455/186 |
| 4,301,540 | 11/1981 | Sato et al. ........................... 455/186 |

FOREIGN PATENT DOCUMENTS 2559860  9/1975  Fed. Rep. of Germany .

OTHER PUBLICATIONS

IEEE Transactions on Consumer Electronics, vol. CE-26, No. 1, Feb. 1980, pp. 20-26, vol. CE-25, No. 4, Aug. 1979, pp. 621-622.

Primary Examiner—Richard Murray
Attorney, Agent, or Firm—N. Rhys Merrett

[57] ABSTRACT

A tuning signal having a duty cycle representing a transmission frequency to be received is converted by a D/A converter to a tuning voltage which in turn is applied to a voltage variable tuning capacitance in the receiver input stage. To avoid the effects of ripple on the tuning voltage, the instantaneous d.c. level of the tuning voltage is stored on a capacitor during the tuning operation. On completion of tuning, the tuning voltage is disconnected and the stored capacitor voltage is applied to the tuning capacitance, thereby eliminating the unwanted ripple voltage. The tuning voltage produced by the D/A converter as well as that stored by the storage capacitor, are connected to the input of a voltage follower amplifier whose output is connected to the tuning capacitance. The amplifier design is such that when its input and output voltages are equal, its quiescent current is small whereas when its input and output voltages differ a current source is switched to provide a large output current. Thus, the tuning voltage applied to the tuning capacitance rapidly follows changes in the input tuning signal.

23 Claims, 9 Drawing Figures

METHOD FOR TUNING THE INPUT STAGE OF A RECEIVER TO A DESIRED RECEIVING FREQUENCY AND CIRCUIT ARRANGEMENT FOR CARRYING OUT THE METHOD

The invention relates to a method for tuning the input stage of a receiver to a desired transmission frequency and a circuit arrangement for carrying out the method.

In one such method, U.S. Pat. No. 4,159,487 issued to K. Elshuber, L. Gotz and H. Tonn on June 26, 1979, for "Low Cost Memory Station" and assigned to Texas Instruments Deutschland GmbH, a tuning signal whose duty cycle represents a received frequency is converted to a tuning voltage. The tuning voltage is applied to a variable capacitance diode in the input stage of the receiver in which the frequency of the heterodyning oscillator is determined in each case by the capacitance of the variable capacitance diode. A given duty cycle of the tuning signal produces a given tuning voltage at the output of the signal converter which because of the effect of the variable capacitance diode produces a particular frequency of the heterodying oscillator and thus a corresponding tuning of the receiver. By varying the duty cycle of the tuning signal the receiver can be tuned to any desired incoming transmission frequencies.

In this tuning method the tuning voltage has a certain residual ripple which produces at the variable capacitance diode a capacitance change which results in corresponding fluctuations of the oscillating frequency of the heterodying oscillator. Such frequency fluctuations are undesirable in many cases because they make a clean and constant tuning of the receiver to a desired transmission frequency very difficult.

The invention is concerned with providing a tuning voltage to the input stage of the receiver without residual ripple. Accordingly, the invention provides a method for tuning the input stage of a receiver to a desired transmission frequency in which a tuning signal whose duty cycle represents a received frequency is converted to a tuning voltage which is applied to the input stage for the tuning, wherein the instantaneous value of the tuning voltage applied during the tuning operation to the input stage is stored, and after completion of the tuning operation the application of the tuning voltage to the input stage is interrupted and the previously stored instantaneous value of the tuning voltage is applied to the input stage.

In the method according to the invention the tuning voltage with a residual ripple is stored on the one hand during the tuning operation and on the other hand is applied to the input stage for the tuning while it is disconnected from the input stage after the execution of the tuning operation. Thus, after execution of a tuning operation the stored voltage, and not the tuning voltage with ripple, is applied to the input stage. This stored voltage is a pure d.c. voltage which permits stable and exact tuning of the input stage to the desired transmission frequency. There is also provided a signal receiver operable to effect a tuning operation in accordance with a method according to the invention, comprising a d.c. voltage tunable input stage and tuning voltage generation means having a circuit output for supplying a variable d.c. tuning voltage to the input stage and including signal converter means for converting a tuning signal whose duty cycle represents a transmission frequency to a d.c. tuning voltage, control circuit means for furnishing signals characterizing tuning operations for respective transmission frequencies; voltage storage means connected to circuit output; switch means operable for connecting the signal converter means to said voltage storage means for the duration of a tuning operation characterizing signal furnished by said control circuit means for storage of the instantaneous d.c. level of the d.c. tuning voltage by said voltage storage means, and thereafter disconnecting the signal converter means from said voltage storage means.

Preferably, the voltage storing means is connected to the circuit output of the tuning voltage generation means by a buffer amplifier, suitably a voltage follower amplifier. For an input stage employing an oscillator having a voltage dependent capacitance for controlling the oscillator frequency, this results in a capacitive load for the amplifier. The output voltage of the follower amplifier then can follow changes of the input voltage only as fast as the charge of the capacitive load can be changed. This rate of change is dependent on the time constant which depends on the output impedance of the voltage follower amplifier and the capacitance of the capacitive load. A rapid change can be achieved by constructing the output stage of the voltage follower amplifier with low output impedance but this requires a high quiescent current in the output stage. This is undesirable particularly when voltage changes occur only at relatively long time intervals as is the case in electronic tuning ciruits. On the other hand, if the output stage of the voltage follower amplifier has a high impedance, the quiescent current is small but the output voltage follows changes of the input voltage only slowly.

It is therefore desirable to provide a voltage follower amplifier whose quiescent current is small and whose output voltage nevertheless follows changes of the input voltage rapidly. Accordingly, an advantageous feature of the invention is a voltage follower amplifier comprising differential amplifier stage means having an output connected to an inverting input, a non-inverting input for receiving an input voltage, and a common input supply circuit including a switchable constant current source, said differential amplifier stage means for producing at said output an output current which corresponds to the difference between supply output currents of said transistors; and control circuit means for responding to the existence of a voltage difference between said input voltage and an output voltage produced by said output current to switch said current source from a low supply current mode to a high supply current mode.

In the voltage follower amplifier, in a quiescent state, i.e. when the output voltage is equal to the input voltage, the total current flowing via the differential amplifier stage is small. This corresponds to a large output impedance but is not disadvantageous because the output voltage must not be subjected to any variations. However, as soons as a voltage difference is present which requires a change in the output voltage, the total current flowing via the differential amplifier stage is switch to a large value so that the change of the output voltage takes place with a relatively large differential current and consequently very rapidly. In this state the voltage follower amplifier has a small output impedance. Admittedly, it then carries a large current but this is not disadvantageous because it occurs only for a very short time. The switching over is all the more advantageous the greater the quiescent intervals between consecutive voltage changes.

Figure 2:
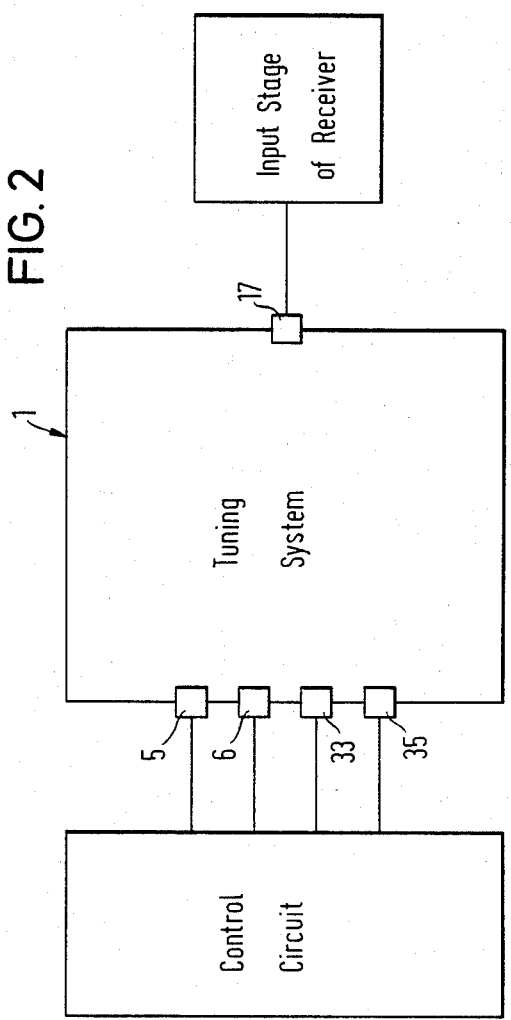
Figure 3:
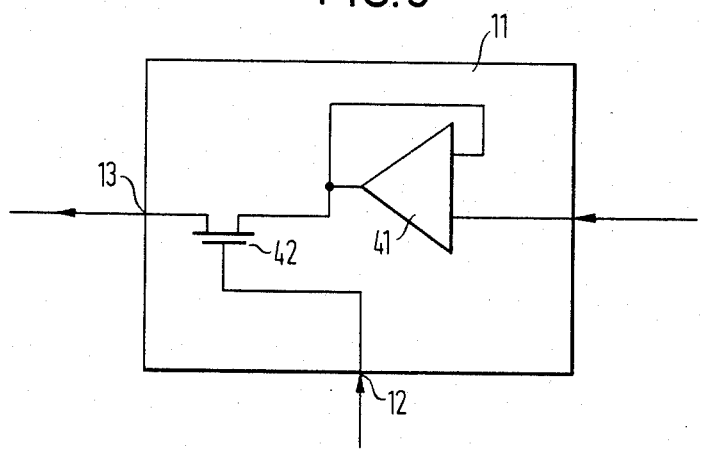
Figure 4:
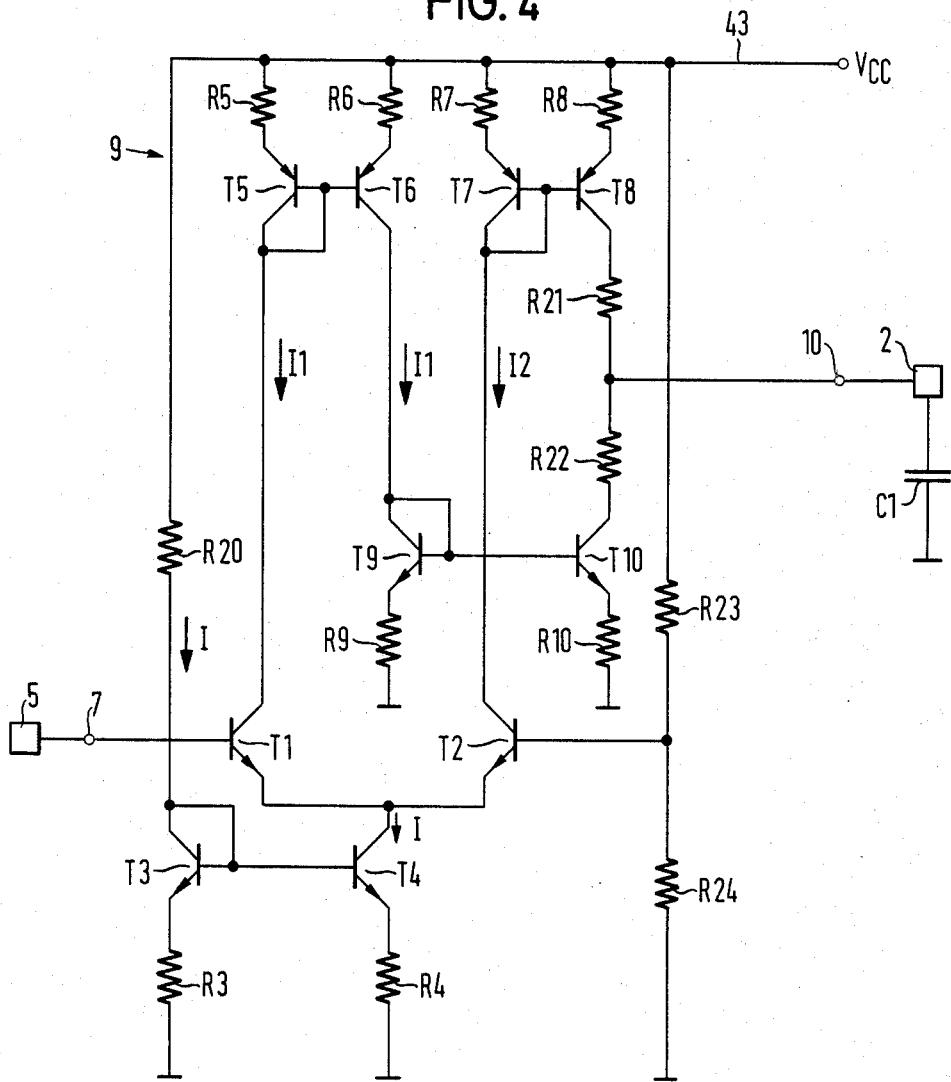
Figure 5:
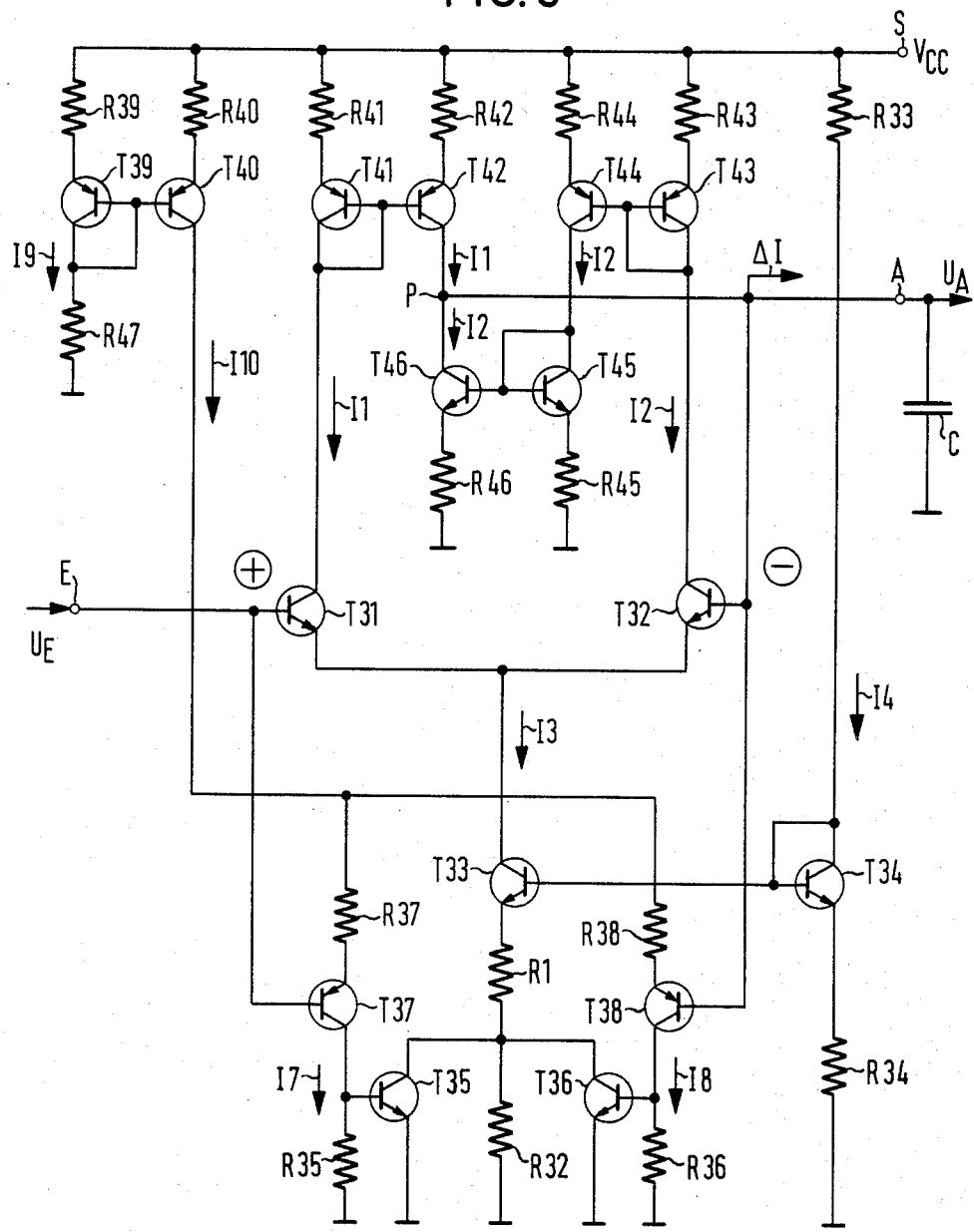
Figure 6:
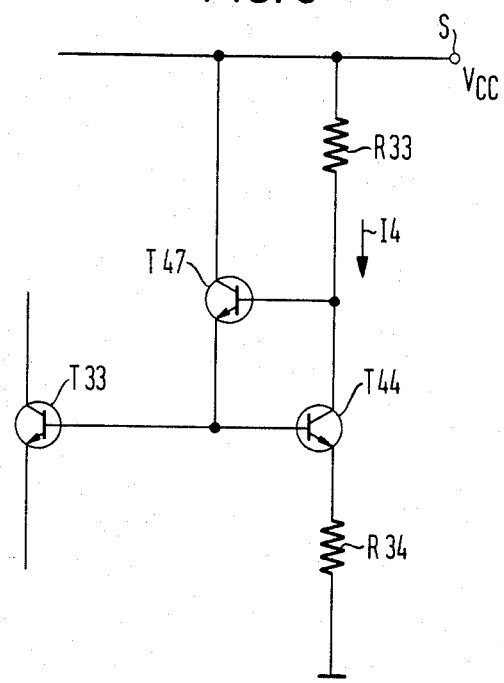
Figure 7A:
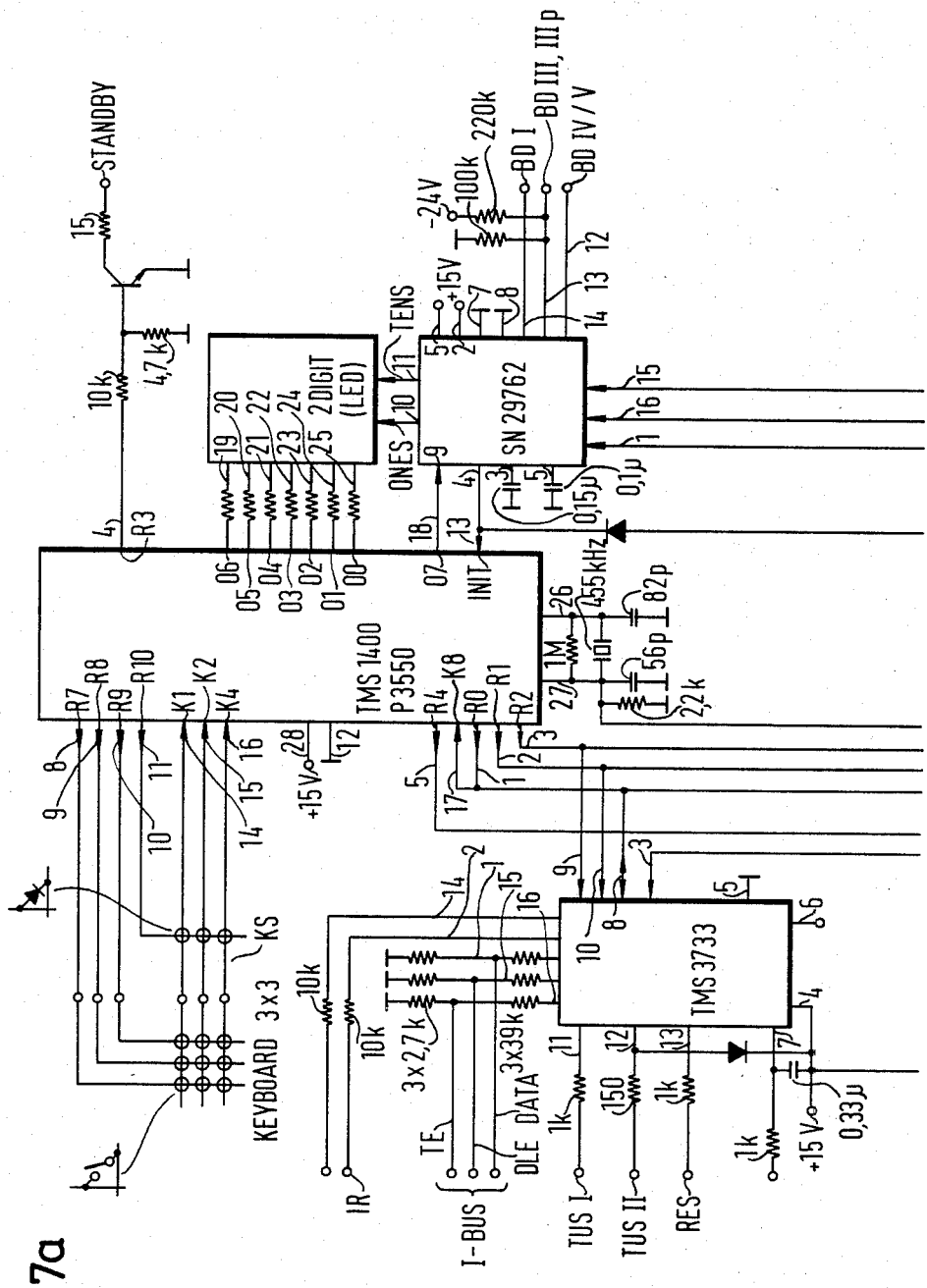
Figure 7B:
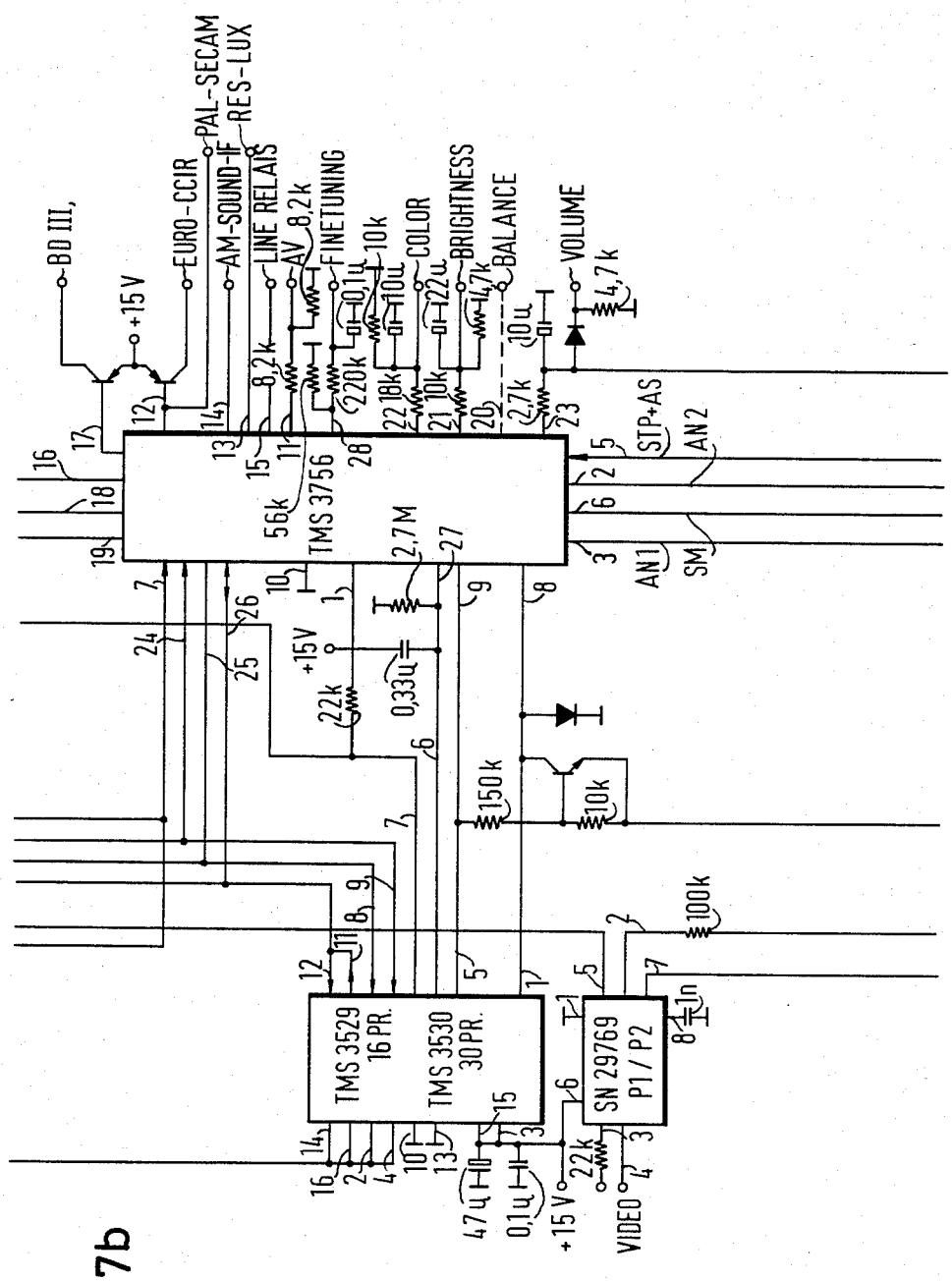
Figure 7C:
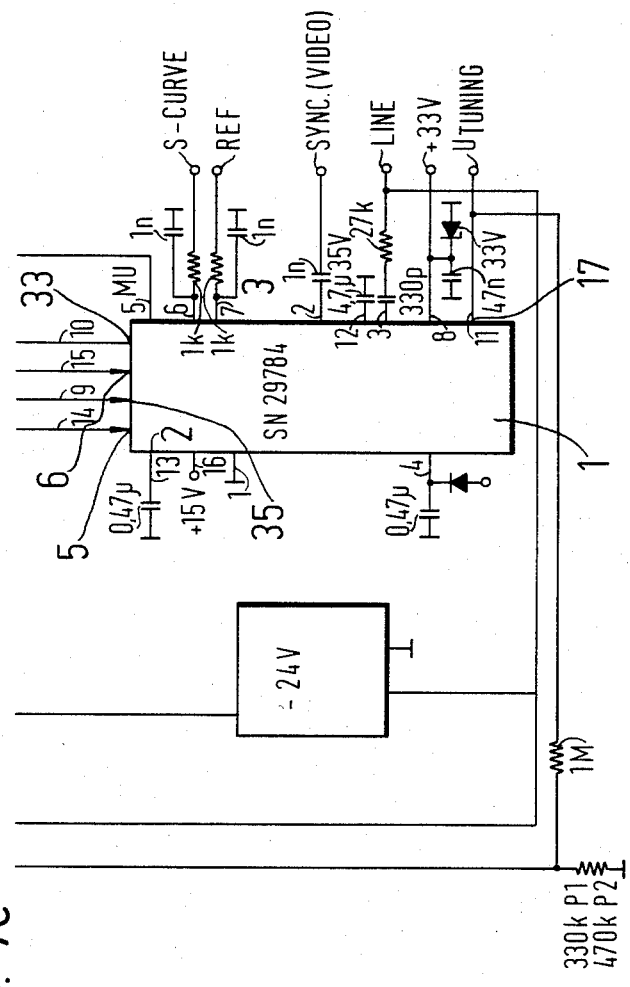

Embodiment of the invention will now be explained by way of example with the aid of the drawings, wherein:

FIG. 1 is a schematic diagram of a circuit arrangement according to the invention, FIG. 2 is a block circuit diagram for explaining the use of the circuit arrangement shown on FIG. 1, FIG. 3 is an example of embodiment of the switching means contained in FIG. 1, FIG. 4 is an example of embodiment of the signal converter contained in FIG. 1, FIG. 5 is the circuit diagram of a voltage follower amplifier according to an advantageous feature of the invention; and FIG. 6 is a modified embodiment of part of the circuit of FIG. 5; and 6

FIGS. 7a–e are tuning systems shown partially as a block diagram with the circuit arrangement according to the invention for use in a television receiver.

The circuit arrangement illustrated in FIG. 1 is intended for use in the tuning section of a television receiver; it may be made for the major part in the form of an integrated circuit. The integrateable part is surrounded by a dashed line 1. The integrateable part is supplemented by three capacitors C1, C2, C3 which are connected to the connections 2, 3 and 5 respectively.

The circuit arrangement of FIG. 1 comprises a connection 5 for receiving a coarse tuning signal and a connection 6 for receiving a fine tuning signal. The tuning signals are signals whose duty cycle represents a predetermined receiving frequency. In the execution of a tuning operation the duty cycle of the coarse tuning signal varies in relatively large steps while the duty cycle of the fine tuning signal varies in small steps. The distinction between the coarse tuning signal and the fine tuning signal may also be in the form that the rate of variation of the coarse tuning signal is greater than the rate of variation of the fine tuning signal.

The tuning signals are applied to inputs 7, 8 of a signal converter 9 which produces a tuning voltage at the output 10 from the particular input signal applied. Since, as already mentioned, the input voltage of the signal converter is a signal whose duty cycle characterizes the desired receiving frequency, the signal converter 9 forms the DC voltage mean value of the input voltage because this DC voltage mean value is proportional to the duty cycle of the input signal. In the simplest case the signal converter 9 is a low-pass filter and the capacitor C1 connected to the connection 2 may be part of this low-pass filter.

The tuning voltage produced by the signal converter 9 is applied to a switching means 11 which depending upon a control signal applied to its control input 12 passes said voltage to its output 13 or blocks said voltage. The output 13 of the switching means 11 is connected to the connection 3 and the input 14 of a voltage follower (operational) amplifier 15 which acts as impedance transformer or buffer and has the gain 1. The output 16 of the voltage follower amplifier 15 is connected to the circuit output 17.

The circuit arrangement of FIG. 1 also contains a coincidence testing circuit 18 with the aid of which it may be established whether the receiver is receiving a television transmission signal. This coincidence testing circuit 18 is constructed in the manner described in DE-OS 2,559,860. It receives at an input 19 synchronizing pulses from the pulse separating stage of the receiver and at a further input 20 the line flyback pulses from the line end stage. The coincidence testing circuit 18 utilizes the fact that only when genuine television signals are received is there coincidence between the synchronizing pulses and the line flyback pulses. In the case of such coincidence it furnishes at its output 21 signals which charge the capacitor C3 connected to the connection 4. As soon as the voltage at the capacitor C3 exceeds a predetermined value a Schmitt-Trigger 22 connected to the output 21 of the coincidence testing circuit 18 responds and furnishes at its output 23 a signal of a high value.

The circuit arrangement of FIG. 1 also contains a Schmitt-Trigger 24 which at an input 25 receives the output signal of a conventional S-curve discriminator which on tuning of the receiver to a receiving frequency furnishes a signal with a predetermined desired value. At the other input 26 of the Schmitt-Trigger 24 a reference signal is applied whose value is equal to the desired value furnished by the discriminator. The Schmitt-Trigger 24 switches its output signal form the low value to the high value when the output signal of the S-curve discriminator has a first relatively large difference from the desired value and it switches its output signal back to the low signal value when the discriminator output signal has a second relatively small difference from the desired value.

The input signals applied to the Schmitt-Trigger 24 are also applied to a frequency control circuit designated briefly as AFC circuit 28 which furnishes at the output 29 a signal which is proportional to the deviation of the discriminator output signal from the desired value. This AFC circuit can be constructed in the manner described in U.S. Pat. No. 4,004,231 issued to K. Elshuber and L. Gotz on Jan. 18, 1977 for "AFC Circuit" and assigned to Texas Instruments Incorporated. It generates a control current proportional to the control deviation. The AFC circuit 28 also comprises a control input 30 which blocks the circuit output when the signal applied thereto has a high value. As apparent from FIG. 1, the output 29 of the AFC circuit 28 is connected the input 14 of the voltage follower amplifier 15. Thus, the voltage furnished by the switching means 11 and stored at the capacitor C2 passes to said voltage follower amplifier 15 and can be varied by the output current of the AFC circuit 28.

The output 27 of the Schmitt-Trigger 24 is connected to an input of an AND gate 31 whose output is connected to an input of an OR gate 32. The output of the OR gate leads to an output connection 33. The circuit arrangement of FIG. 1 contains an inverter stage 34 which inverts a signal applied to the input connection 35. The signal applied to the input connection 35 is also applied in non-inverted form to the second input of the AND gate 31. The output signal of the inverter stage 34 is applied to the input 36 of a logic state 37 which comprises an AND circuit with two inputs. One input of the AND gate 38 forms the inputs 36 of the logic state 37 and the other input is connected to the output 23 of the Schmitt-Trigger 22. The output 39 of the logic state 37 is connected to the control input 12 of the switching means 11 and also leads to an inverter 40 whose output is connected to the control input 30 of the AFC circuit 28. A further output 41 of the logic state is connected to the second input of the OR gate 32.

The circuit arrangement illustrated in FIG. 1 is intended for cooperation with a control circuit as shown by the block circuit diagram of FIG. 2. This control circuit furnishes to the connections 5 and 6 the aformentioned coarse and fine tuning signals and also applies to the connection 35 a signal which indicates that a tuning operation is to be performed; the control circuit receives from the connection 33 from the circuit arrangement illustrated here a signal which informs it on the execution and course of the tuning operation. The signal applied to the connection 35 from the control circuit is for example initiated by the operator of the receiver actuating a search key. On actuation of such a search key the control circuit applies a signal with high value to the connection 35; such a signal with high value is also applied to the connection 35 when the operator switches the receiver from one station to another by actuating a corresponding station key. In the case of the search mode the high signal value remains at the connection 35 until tuning to a station has been effected while the high signal value in the case of station change is present only for a predetermined time. Further details will be apparent from the following exact explanation of the mode of operation of the circuit arrangement of FIG. 1. In the first case mentioned the control circuit acts practically as time control means which for a predetermined duration furnishes a signal characterizing a tuning operation while in the second case it acts as a control circuit which varies the duty cycle of the tuning signal in a range representing the receiving frequency range and furnishes the signal characterizing the tuning operation. Such a control circuit may for example be made as integrated semiconductor circuit.

For the description of the mode of operation of the circuit arrangement of FIG. 1 it will be assumed that the operator intends to carry out a search operation during which the heterodyning oscillator in the input stage of the receiver is tuned through a predetermined receiving range. In this tuning operation the operator can recognize which stations can be received in the particular tuning range of the receiver.

After depression of a search key the control circuit applies to the connection 35 a signal of high value. At the same time it starts to apply to the connection 5 the coarse tuning signal which, as already mentioned, is a pulse signal whose duty cycle is varied stepwise. The signal converter 9 generates from the coarse tuning signal a tuning voltage which assumes stepwise higher values during the tuning.

The signal with high value at the connection 35 is inverted by the inverter stage 34 so that at the input 36 of the logic state 37 a signal with low value is applied. The AND gate 38 thus also furnishes a signal with low value. The switching means 11 receives said signal with low value at its input 12 and is so constructed that it passes the analog voltage applied to its input to the output 13 when a low signal value is present at its control input 12.

FIG. 3 shows an example of a possible construction of the switching means 11. The switching means 11 contains a voltage follower amplifier 41 which acts merely as impedance transformer and has the gain 1. Connected to the output of the voltage follower amplifier 41 is a field-effect transistor 42 which passes the output voltage of the follower amplifier 41 to the output 13 of the switching means 11 when a signal with low value is applied to its gate electrode connected to the control input 12. When a signal with high value is applied to the control input 12 and thus the gate electrode 42 the output of the voltage follower amplifier 41 is isolated from the output 13 of the switching means 11.

Due to the low signal value at the input 12 of the switching means 11 the tuning voltage from the signal converter 9 passes to the input 14 of the voltage follower amplifier 15 and to the capacitor C2 connected to the connection 3. The voltage follower amplifier 15 passes the voltage applied to its input 14 with unchanged value to its output 16 and thus also to the circuit input 17. Thus, the voltage present at the circuit output 17 is always exactly stored at the capacitor C2. From the point of view of its mode of operation, the capacitor C2 acts as if it were connected directly to the circuit output 17. Connected to the circuit output 17 is a variable capacitance diode in the input stage of the receiver whose capacitance determines the oscillation frequency of the heterodyning oscillator. With the aid of the voltage at the circuit output 17 it may therefore be established to which frequency the receiver is tuned.

The low value signal at the output 39 of the logic stage 37 is inverted by the inverter 40 so that it appears at the control input 30 of the AFC circuit 28 as signal with high value. This high value signal at the control input 30 renders the AFC circuit 28 inoperative. This can be achieved in that as in the case of the switching means 11 the output signal of the AFC circuit is applied via a field-effect transistor to the output 29, said field-effect transistor being non-conductive when a signal with high value is applied to its gate electrode connected to the control input 30.

Since the AFC signal 28 is inoperative only the tuning voltage generated by the signal converter 9 passes to the circuit output 17 and is simultaneously also stored in the capacitor C2.

Now, if the duty cycle of the coarse tuning signal applied to the connection 5 is increased stepwise the tuning voltage furnished by the signal converter 9 also increases stepwise and appears at the circuit output 17. This leads to the desired tuning of the receiver in a desired frequency range. Now, if a station frequency emitted by a television transmitter is received the discriminator of the receiver indicates this by furnishing the S-shaped output signal in known manner. The Schmitt-Trigger 24, which receives the output signal of the discriminator at the input 25, switches the signal at its output 27 to a high signal value when the value of the signal applied to its input 25 has a first predetermined difference from the value of the reference signal applied to its input 26. This condition occurs when the tuning point of the receiver approaches exact tuning to the station but is still relatively far from the exact tuning point. Since, as has already been explained, during the search mode a signal of high value is applied to the connection 35, and a signal with high value is now also present at the output 27 of the Schmitt-Trigger 24, the AND gate 31 also furnishes a signal with high value at its output and this signal passes via the OR gate 32 to the connection 33. The control circuit connected to the connection 33 recognizes this signal with high signal value and thereupon disconnects the coarse tuning signal at the connection 5 and applies instead the fine tuning signal to the connection 6. The tuning operation is now continued under the control of the fine tuning signal at the connection 6, the tuning rate being lower than previously. The output signal of the discriminator at the input 25 of the Schmitt-Trigger 24, during the further tuning, approaches the desired value which at the same time is the reference signal value applied to the input 22. As soon as the value of the discriminator signal has a second predetermined difference from the reference signal value, which is less than the first predetermined difference mentioned, the Schmitt-Trigger 24 again switches its output signal at the output 27 to the low signal value.

The low signal value at the output 27 of the Schmitt-Trigger 24 also causes a signal with low value to occur at the connection 33. The control circuit recognizes this low signal value; it reacts by no longer varying the fine tuning signal at the connection 6 and switching the signal applied to the connection 35 to a low value. The receiver is now tuned to a frequency which is very close to the frequency of the station received.

The signal with low value at the connection 35 is inverted by the inverter stage 34 so that a signal with high value is present at the input 36 of the logic stage 37. If the high-frequency signal received by the receiver is in fact a television signal this is recognized by the coincidence testing circuit 18 so that the Schmitt-Trigger 22 responds and furnishes at its output 23 a signal with high value. The AND gate 38 in the logic state 37 thus receives at both inputs a signal with high value so that signals with high value also appear at the outputs 39 and 41 of the logic stage 37. The signal at the output 39 passes as control signal to the control input 12 of the switching means 11, rendering the field-effect transistor 42 in said switching means 11 non-conductive. Thus, the tuning voltage generated by the signal converter 9 no longer reaches the circuit output 17 but instead the voltage stored at the capacitor C2 which has the same value as the tuning voltage but without the ripple thereof.

The signal at the output 39 is inverted by the inverter so that at the control input 30 of the AFC circuit 28 a signal with low value occurs. The control current furnished by the AFC circit 28 thus varies the voltage stored at the capacitor C2 so that at the circuit output 17 a tuning voltage appears which tunes the receiver exactly to the desired frequency. The voltage follower amplifier 15 has no influence on the magnitude of the voltage furnished at the circuit output 17 because its gain has the value 1. Its purpose is only the low-resistance passage of the tuning voltage to the circuit output 17 and prevention of discharge of the capacitor C2 due to its high imput impedance.

If the high-frequency transmission signal received by the receiver is not a television signal this can be established by the coincidence testing circuit 18. In this case the coincidence testing circuit 18 does not provide any signal which could charge the capacitor C3 so that the Schmitt-Trigger 22 does not respond and does not furnish a signal with high value at its output 23. The absence of a signal with high value at the output 23 of the Schmitt-Trigger 22 leads to a signal with low value occurring at the outputs 39 and 41 of the logic state 37. As a result the switching condition of the switching means 11 is not changed so that the tuning voltage from the signal converter 9 continues to reach the output 13 and the AFC circuit 28 remains inoperative. The low signal value at the output 41 also appears at the connection 33 where it is detected by the control circuit. When the control circuit detects a signal with low value at the connection 33, after effecting the change from coarse tuning to fine tuning, it recognizes this as the condition that no television signal is being received by the receiver. It therefore applies to the connection 35 a signal of high value again which causes the search operation to be continued until a further high-frequency signal is received by the receiver.

If the high-frequency signal received by the receiver was a television transmission signal the search operation is not interrupted and the now operative AFC circuit 28 provides a control for the exact tuning of the receiver to the station frequency. The operator now has the possibility of storing a number identifying the input signals of the signal converter 9 so that in a subsequent operating phase by simply calling up this identification number the input signals of the signal converter 9 can be reproduced and the receiver can be tuned again to the exact tuning point without having to conduct another search.

Now, once a tuning point has been found at which the receiver receives a high-frequency signals emitted by a television transmitter the operator can continue the search operation by depressing a search key again which leads to a signal with high value again being applied to the connection 35. The search operation described above is then continued from the tuning point already reached. In this manner a desired frequency range can be searched for the presence of television stations to be received.

It will now be described how the circuit arrangement illustrated in FIG. 1 behaves when the operator, by actuating a station key, wants to receive a certain television station after having stored in a previous search operation operation identification magnitudes on the tuning signals which must be applied to the signal converter 9 so that a tuning to the particular television station desired can be effected.

When the operator depresses a station key the control circuit applies a signal with high value to the connection 35. Simultaneously, a tuning signal is also applied to the signal converter 9 by the control circuit and is converted to a tuning voltage which passes to the circuit output 17 and tunes the receiver to the desired station. This tuning voltage is again stored at the capacitor C2. After a predetermined time, which is so dimensioned that it is certain that the tuning voltage has been generated from the tuning signal at the signal converter 9 and the tuning voltage stored in the capacitor C2, the control circuit again changes the signal at the connection 35 to a low value. This effects in the manner already described above in conjunction with the search operation disconnection of the output 10 of the signal converter 9 from the circuit output 17 by means of the switching means 11 and activation of the AFC circuit 28. A tuning voltage is thus at the circuit output 17 which holds the receiver tuned exactly to the desired frequency.

On calling up a station the control circuit acts practically like a time control means which holds the signal applied to the connection 35 at a high value for a predetermined time. This time may suitably be set to 200 to 300 ms, because during this period the receiver should be tuned to a desired TV station.

Due to the insertion of the switching means 11 and the capacitor C2 it is ensured that the voltage at the circuit output 17 determining the tuning point of the receiver is always completely free of ripple as soon as the particular tuning operation is concluded. The tuning voltage with ripple from the output 10 of the signal converter 9 is passed to the circuit output 17 only during the actual tuning operations, i.e. during operating modes in which the tuning voltage applied to the input stage varies in any case and the superimposed ripple voltage thus has no disadvantageous effect. In the tuned condition the tuning voltage at the output 17 is a pure DC voltage whose value is determined solely by the voltage at the capacitor C2 and the control current furnished by the AFC circuit 28.

The signal converter may be constructed as shown by the circuit diagram of FIG. 4. It will be assumed for the description that a square-wave voltage at the connection 5 is to be convertted to a voltage which is available at the output 10 and thus also at the connection 2 and the value of which is proportional to the duty cycle of the square-wave voltage at the connection 5. For converting the fine tuning signal a similar signal converter can be used which is connected to connection 6.

The signal converter 9 illustrated in FIG. 4 includes a differential amplifier stage having two npn transistors T1 and T2; the square-wave voltage to be converted passes directly to the base of the transistor T1. The signal converter 9 also includes a plurality of associated transistor pairs T3 and T4, T5 and T6, T7 and T8 and T9 and T10. The transistor pairs are so connected that each pair forms a so-called "current mirror" of known type. Such a current mirror includes an input transistor and an output transistor whose bases are connected together and whose emitters are connected either directly or via resistors to a common terminal (ground). The base and the collector of the input transistor are connected together. A current mirror has the property that the current flowing via the collector-emitter path of the output transistor is in a predetermined ratio to the current passed through the collector-emitter path of the input transistor. Thus, the transistors T3, T5, T7 and T9 are the input transistors and the transistors T4, T6, T8 and T10 the output transistors of the respective current mirrors.

As apparent from FIG. 4 between the collector of the transistor T3 and the supply voltage line 43 to which the supply voltage $V_{CC}$ is applied there is a resistor R20. The emitters of the transistors T3 and T4 are connected via equal resistors R3 and R4 respectively to ground. The collector of the transistor T4 is connected to the interconnected emitters of the transistors T1 and T2. The collector of the transistor T1 is connected to the collector of the transistor T5 which, as mentioned, forms with the transistor T6 a current mirror corresponding to the current mirror comprising the transistors T3 and T4. The collector of the transistor T2 is also connected to the collector of a transistor T7 which forms with the transistor T8 a current mirror. The collector of the transistor T6 is connected to a collector of the transistor T9 which forms with the transistor T10 a current mirror. The collector of the transistor T8 is connected via a resistor R21 to the output 10 and the collector of the transistor T10 is connected via a resistor R22 to the output 10. Between the supply voltage line 43 and the base of the transistor T2 there is a resistor R23 and a resistor R24 is connected between the base of the transistor T2 and ground.

In the circuit described the transistors T1, T2, T3, T4, T9 and T10 are npn transistors while the transistors T5, T6, T7 and T8 are pnp transistors. The resistors R3, R4, R5, R6, R7, R8, R9 and R10 may be neglected in the following circuit description because these resistors are only compensating resistors of low resistance which are intended to compensate possible deviations of the base-emitter voltages of the transistor pairs.

For the following description of the mode of operation of the circuit of FIG. 4 it will be assumed that the supply voltage $V_{CC}$ has the value 5 V and that at the connection 5 there is a voltage having the value 0 V. The resistors R23 and R24 are so dimensioned that at the base of the transistor T2 there is a voltage of about 2.5 V. Under the conditions outlined the transistor T1 is nonconductive and the transistor T2 conductive. The current I2 flowing through the transistor T2 is equal to the current I whose value is fixed by the effect of the current mirror comprising the transistors T3 and T4. In the circuit of FIG. 4 a constant current I always flows through the resistor R20, the transistor T3 and the (negligible) resistor R3. Since the base-emitter voltages of the transistors T3 and T4 are equal, the current I is "mirrored" in the collector of the transistor T4 which means that in both transistors T3 and T4 the same current I flows.

Since always only one of the transistors T1 and T2 is conductive, in the operating case described the current I2 is equal to the current I. The current I2 is at the same time the collector current of the transistor T7 which produces at said transistor a predetermined base-emitter voltage which is also the base-emitter voltage of the transistor T8. For this reason, the current I2 also flows through the transistor T8 and can flow via the resistor R21 as charging current to the capacitor C1. The current through the transistor T8 cannot flow to ground via the transistor T10 because the latter is non-conductive in the operating case assumed. This is because, as already mentioned at the beginning, the transistor T1 is non-conductive, i.e. does not conduct a collector current I1. Because of the current mirror effect of the transistors T5 and T6 no collector current flows in the transistors T6 and T9 either, resulting in the aforementioned blocking of the transistor T10 which also forms a current mirror together with the transistor T9.

If the voltage at the connection 5 has the value 5 V, the transistor T1 becomes conductive and the transistor T2 is rendered non-conductive so that the current I1 assumes the value of the current I and the current I2 becomes zero. Because of the effect of the current mirror comprising the transistors T5 and T6 the current I1 also flows in the collectors of the transistors T6 and T9 and this causes the transistor T10 to become conductive. The current flowing through the transistor T10 discharges the capacitor C1. In this operating condition the transistor T8 is non-conductive since the transistor T2 is also in the non-conductive state and consequently no collector current of the transistor T7 flows and thus also no collector current of the transistor T8 can flow. The description of the function shows that the capacitor C1 is charged whenever the square-wave voltage at the connection 5 has the value 0 V while it discharges when the square-wave voltage has the value 5 V.

The DC voltage arising at the capacitor C1 is thus directly proportional to the duty cycle of the square-wave voltage at the connection 5.

The charging and discharging operations of the capacitor C1 start with a certain delay with respect to the edges of the pulses of the square-wave voltage at the connection because the transistors switching the charging and discharging currents (T7, T8 and T5, T6 respectively) require a certain time to pass from the non-conductive state to the conductive state. If the switch-on delays and the switch-off delays are different at different temperatures a falsification of the duty cycle of the square-wave voltage may result. Because of the circuit of the signal converter 9 illustrated in FIG. 4 is made completely symmetrical the aforementioned delay times are also completely identical so that there is no falsification of the duty cycles on temperature changes. Irrespective of whether the integration operation is conducted at a high or low ambient temperature for a predetermined duty cycle of the pulse sequence at the input the same voltage occurs at th capacitor C1.

The voltage follower amplifier 15 of FIG. 1 may advantageously be configured as shown in FIG. 5 and includes a transistor differential amplifier stage comprising two npn transistors T31 and T32. The base of the transistor T31 forms the non-inverting input of the differential amplifier stage and is connected to the input terminal E (14 FIG. 1) to which the input voltage $U_E$ is applied. The base of the transistor T32 forms the inverting input of the differential amplifier stage and is connected to the output terminal A (16 FIG. 1) from which the output voltage $U_A$ is taken. The load connected to the output terminal A consists of a capacitor C whose terminal voltage forms for example the tuning voltage of an electronically tunable input stage of a signal receiver.

As will be explained hereinafter, the differential amplifier stage is so constructed that it renders any voltage difference between its inputs $$\Delta U = U_E - U_A$$

zero, i.e. the output voltage $U_A$ always assumes the value of the input voltage $U_E$. It thus operates as voltage follower.

The emitters (input supply circuit) of the two transistors T31 and T32 are commonly connected to the collector of an npn transistor T33 whose emitter is connected to ground via two resistors R31 and R32 connected in series. The base of the transistor T33 is connected to the base of an npn transistor T34 whose collector is connected via a resistor R33 to the terminal S carrying the positive potential Vcc of the supply voltage and whose emitter is connected via a resistor R34 to ground. The base and the collector of the transistor T34 are short-circuited.

The transistors T33 and T34 form a so-called =current mirror" of known type. Such a current mirror includes an input transistor and an output transistor whose bases are connected together and whose emitters are connected either directly or via resistors to the common circuit terminal (ground). The base and the collector of the input transistor are connected together. A current mirror has the property that the current flowing via the collector-emitter circuit of the output transistor is in a predetermined ratio to the current passed through the collector-emmitter circuit of the input transistor. Thus, in the circuit illustrated the transistor T34 is the input transistor and the transistor T33 the output transistor of the current mirror. Since the transistor T34 is connected via the resistors R33 and R34 directly to the supply voltage, it carries a constant current I4. Thus, a constant current I3 which is in a predetermined ratio to the current I4 also flows throught the transistor T33. The ratio between the two currents I3 and I4 is determined by the emitter resistors of the transistors T33 and T34. If these emitter resistors were of equal magnitude, i.e. R31+R32=R34, the currents I3 and I4 would also be equal. However, in the present case the resistors are differnetly dimensioned, the resistor R32 having a resistance large compared with that of the resistor R34 while the resistor R31 has a small value compared with that of the resistor R32. For example, the following values may be chosen:

R31 = 100
R34 = 1000
R32 = 10000

Thus:

R32 = 10.R34

R31 = 1/10·R34 = 1/100·R32.

Connected in parallel with the resistor R32 are the collector-emitter paths of two npn transistors T35 and T36. When these two transistors are non-conductive, the resistor R32 is in series with the resistor R31 in the emitter circuit of the transistor T33. The current I3 is then determined substantially by the resistor R32, compared with which the resistor R31 is negligible. Thus, in the above numerical example the following relationship applies approximately for the current I3:

I3 = R34/R32 ·I4 = 1/10·I4.

If on the other hand one of the transistors T35, T36 is conductive the resistor R32 is short-circuited. The emitter resistor of the transistor T33 is then formed by the resistor R31 alone and the following relationship applies in this state for the current I3':

I3' = R34/R31·I4 = 10·I4.

I3' = 100·I3.

In each of these two states the transistor T33 forms the constant current source lying in the common emitter circuit for the differential amplifier stage formed by the transistors T31 and T32; however, by means of the transistors T35 and T36 the current imposed by the constant current source may be switched over, in the example of embodiment in the ratio 1:100.

The base of the transistor T35 is connected to the collector of a pnp transistor T37 and via a resistor R35 to ground. The base of the transistor T36 is connected in the same manner to the collector of a pnp transistor T38 and via a resistor R36 to ground. The resistors R35 and R36 are of equal magnitude. The base of the transistor T37 is connected to the input terminal E and the base of the transistor T38 is connected to the output terminal A.

The emitters of the transistors T37 and T38 are connected via resistors R37 and R38, respectively, of equal magnitude, to the output of a further current mirror which is formed by two pnp transistors T39 and T40 whose bases are connected together and whose emitters are connected via resistors R39 and R40 respectively to the terminal S. The transistor T39, whose base and collector are short-circuited, forms the input transistor of the current mirror; its collector is connected via a resistor R47 to ground so that a constant current I9 flows via transistor T39. Accordingly, a constant current I10 also flows via the output transistor T40 of the current mirror. The current mirror T39/T40 thus forms a constant current source which lies in the common emitter circuit of the transistors T37 and T38. The two transistors T37 and T38 form a second differential amplifier stage which receives the same control voltages as the differential amplifier stage formed by the transistors T31 and T32 but is complementary to the letter stage. The two outputs of the differential amplifier stage formed by the transistors T37, T38 control the transistors T35 and T36. In the collector circuit of the transistor T31 there is the input transistor of a further current mirror which is formed by two pnp transistors T41, T42. The emitters of the transistors T41, T42 are connected via equal magnitude resistors R41 and R42 respectively to the terminal S. Since the collector current I1 of the transistor T31 forms the input current of the current mirror, the same I1 also flows via the collector of the output transistor T42.

In the collector circuit of the transistor T42, in corresponding manner, there is the input transistor of a current mirror which is formed by two pnp transistors T43, T44. The emitters of the transistors T43 and T44 are connected via equal magnitude resistors R43 and R44 respectively to the terminal S. Since the collector current I2 of the transistor T32 forms the input current of said current mirror, the same current I2 also flows via the collector of the output transistor T44.

The output of the current mirror T43/T44 is connected to the input of a further current mirror which is formed by two npn transistors T45, T46 whose emitters are connected via equal magnitude resistors R45 and R46 to ground. The collector of the input transistor T45 of said current mirror is connected to the collector of the transistor T44 so that the input current of the current mirror T45/T46 has the value I2. Accordingly, the current I2 also always flows via the collector of the output transistor T46 of said current mirror.

The collectors of the two transistors T42 and T46, i.e. the outputs of the two current mirrors T41/T42 and T45/T46, are connected together at the point P and to the output terminal A.

To explain the mode of operation of this circuit it will first be assumed that the output voltage $U_A$ is equal to the input voltage $U_E$, i.e. the voltage difference U is zero.

In this quiescent condition the base voltages of the transistors T31 and T32 are of equal magnitude; accordingly, the currents I1 and I2 are also of equal magnitude. Since the sum of these currents is equal to the current I3, the following relationship applies:

I1 = I2 = I3/2

Since the voltage $U_E$ and $U_A$ are also applied to the bases of the transistors T37 and T38, in the quiescent state the base voltages of these transistors and accordingly the currents I7 and I8 are also of equal magnitude. Thus:

I7 = I8 = I10/2.

The constant current source formed by the current mirror T39/T40 is so dimensioned that the voltage drop produced by half the current I10 at the resistor R35 or the resistor R36 is not adequate to render conductive the transistor T35 or the transistor T36 respectively. If the base-emitter voltage of these transistors is designated as $U_{BE}$ the following relationships apply:

I10/2·R35 $U_{BE}$

I10/2·R36 $U_{BE}$.

Thus, the two transistors T35 and T36 are non-conductive in the quiescent state so that the resistor R32 in the emitter circuit of the transistor T33 is effective in series with the resistor R31. The current I3 is thus very small (1/10 of the current I4) and consequently the currents I1 and I2 are also very small.

As previously explained, the current mirror T31/T32 controlled by the collector current of the transistor T31 compels the current flowing from the terminal S to the circuit point P to have the value I1 and the two current mirrors T43/T44 and T45/T46 controlled by the collector current of the transistor T32 and connected in series compel the current flowing from the circuit point P to ground to have the value I2. Since the currents I1 and I2 are of equal magnitude in the quiescent state no current can flow from the circuit point P via the output terminal A to the load or from the load via the output terminal A to the circuit point P. The charge of the capacitor C does not change and the terminal voltage of the capacitor C remains unchanged and equal to the input voltage $U_E$.

As already explained the currents I1 and I2 are very small in the quiescent state. This has firstly the advantage that the current consumption of the circuit in the quiescent state is small. Furthermore, the output impedance of the circuit, seem from the output terminal A, is very high.

When the input voltage $U_E$ is changed the previously outlined quiescent equilibrium condition is destroyed. Since the output voltage $U_A$ first retains its value, a voltage difference ΔU arises between the two inputs of the differential amplifier stage T31/T32. The same voltage difference ΔU is also present between the two inputs of the differential amplifier stage T37/T38.

It will first be assumed that the input voltage $U_E$ is increased so that the voltage difference ΔU is positive. The consequence of this in the differential amplifier stage T37/T38 is that the transistor T37 is rendered non-conductive so that the entire current I10 now flows through the transistor T38. A constant current source formed by the current mirror T39/T40 is so dimensioned that the voltage drop produced by the entire current I10 at one of the resistors R35 or R36 is greater than the base-emitter voltage of the transistors T35 and T36, i.e.:

I10·R35 > $U_{BE}$

I10·R36 > $U_{BE}$

While the transistor T35 remains non-conductive, the transistor T36 is thus now rendered conductive and short-circuits the resistor R32.

The emitter resistor of the transistor T33 is now formed solely by the resistor R31. The current I3 thus assumes a large value which in the numerical example given above is about 100 times the value in the quiescent state. The currents I1 and I2 are increased in the same ratio. Due to the increase of the input voltage $U_E$ at the noninverting input of the differential amplifier stage T31/T32 compared with the voltage $U_A$ at the inverting input the current I1 becomes greater than the current I2. There is thus a current difference at the circuit point P. The current difference:

ΔI = I1 − I2 flows from the circuit point P via the output terminal A to the capacitor C so that the charge of the latter is increased. As a result, the terminal voltage of the capacitor C, i.e. the output voltage $U_A$, increases. As soon as the output voltage $U_A$ has reached the new value of the input voltage $U_E$ the currents I1 and I2 are again of equal magnitude. The quiescent equilibrium condition is then reestablished. The equilibrium condition then also obtains again in the differential amplifier stage T37/T38 and in this condition the currents I7 and I8 are of equal magnitude and in each case equal to half the current I10. The two transistors T35 and T36 are non-conductive so that the resistor R32 is no longer short-circuited. The current I3 again has the low value and accordingly the currents I1 and I2 are also again very small.

On the other hand, if the input voltage $U_E$ is reduced so that a negative voltage difference $\Delta U$ is across the two differential amplifier stages the transistor T38 is rendered non-conductive so that the entire current I10 flows via the transistor T37 and the resistor R35, rendering the transistor T35, conductive so that it short-circuits the resistor R32. The current I3 then again assumes the large value. In this case the current I2 becomes greater than the current I1 so that a current difference $-\Delta I$ flows from the capacitor C to the circuit point P. The charge of the capacitor C decreases and the output voltage $U_A$ becomes smaller. As soon as the output voltage $U_A$ has reached the new value of the input voltage $U_E$ the quiescent equilibrium state is reestablished.

Since the currents I1 and I2 have a high value during the presence of a voltage difference $\Delta U$, the current difference $\Delta I$ is correspondingly large and consequently the change of the charge of the capacitor C takes place rapidly. This corresponds to a low output impedance of the voltage follower amplifier.

The complementary transistors T42 and T46 form for the load a push-pull end stage whose output impedance can be switched over in dependence upon the presence of a voltage difference $\Delta U$. The transistors T35 and T36 form switches which on actuation by short circuiting the resistor R32 switch the output impedance to the low value. These switches are controlled by the differential amplifier stage formed by the transistors T37 and T38 and responding to the presence of a voltage difference $\Delta U$.

Since the entire circuit is made up only from transistors and resistors it is particularly adapted to construction as monolithically integrated semiconductor circuit. Because of its symmetrical construction it has a very high temperature stability.

As regards the dimensioning of the resistors it should be remembered that the resistors R41, R42, R43, R44, R45, R46 are very small and serve only as compensation resistors for compensating different base-emitter voltages of the transistors T41, T42, T43, T44. The effect of these resistors is neglibible as regards the mode of operation of the circuit.

Modifications of the circuit described are of course possible. In the construction as integrated circuit, for example, the resistor R32 may be omitted and the connection point of the collectors T35, T36 connected with the resistor R31 to a terminal pin. An external adjustable resistance may be connected to this terminal pin and forms the resistor R32. This makes it possible to adjust the high input impedance of the circuit in the quiescent state.

Another possible modification of the voltage follower amplifier is shown in FIG. 6. It resides in that the direct connection between the collector and the base of the transistor T34 is replaced by a further npn transistor T47 whose base is connected to the collector and whose emitter to the base of the transistor T34 while the collector of the transistor T47 is connected to the terminal S. This modification has the effect of making the current I4 independent of the base current of the transistors T33 and T34. This base current is furnished via the transistor T47.

The circuit arrangement as described above can be used in a tuning system as shown in the circuit diagram of FIG. 7. In this system the tuning circuit arrangement 1 is shown as an integrated circuit designated SN 29784. The central control unit of this system is a microcomputer TMS 1400 which both in a search operation and in a program change operation recognizes the commands from input keyboard switches KS initiating these operations and supplies all control signals necessary for carrying out these operations. A further integrated circuit designated TMS 3756 in FIG. 5 has among other functions the function of the control circuit shown in FIG. 2 and it supplies to the inputs 5, 6 of a tuning circuit 1 the coarse and fine tuning signals, respectively, and to the input 35 a signal which indicates that a tuning operation is to be effected. From output 33 of the tuning circuit 1 it receives a signal by which it is informed about the execution and the sequence of the tuning operation. In Fig. 7 further terminals of unit SN 29784 forming the tuning circuit 1 are provided with the reference numerals used in the circuit diagram of FIG. 1.

Channel display is provided by a two digit display DIS driven by a power driver circuit PD which also provides an initialization input to the TMS 1400 at input INIT. The TMS 3756 includes non-volatile storage for station memory purposes (additional storage capacity being provided by a memory TMS 3529). The decoder TMS 3733 also provides decode facilities for Teletext or Viewdata inputs on lines TUSI and TUSII and for control of appliances; for example, a video tape recorder, or the lines designated I-BUS. The TMS 3756 also provides outputs compatible with PAL-SECAM and EURO-CCIR television systems.

By means of the keyboard KS or an infrared remote control unit (inputs from which are received on input IR and decoded by the integrated circuit TMS 3733) the tuning system of FIG. 7 is caused to control the automatic search operation or the program change operation. The microcomputer TMS 1400 controls unit TMS 3756 in such a manner that the latter supplies the coarse and fine tuning signals each as a series of pulses. The tuning circuit of FIG. 1 integrates these series of pulses to a dc voltage and supplies it at output 17. This dc voltage tunes the tuner oscillator in known manner to the desired frequency. The unit SN 29784 forming the tuning circuit 1 operates in the manner explained in detail in connection with the circuit diagram of FIG. 1.

What is claimed is:

1. Method for tuning the input stage of a receiver to a desired transmission frequency in which a tuning signal whose duty cycle represents a received frequency is converted to a d.c. tuning voltage which is applied to the input stage for the tuning, wherein the instantaneous d.c. level of the tuning voltage applied during the tuning operation to the input stage is stored, and after completion of the tuning operation the application of the tuning voltage to the input stage is interrupted and the previously stored instantaneous d.c. level of the tuning voltage is applied to the input stage.

2. A signal receiver comprising a voltage tunable input stage and tuning voltage generation means having a circuit output for supplying a d.c. tuning voltage to the input stage and including signal converter means for converting a tuning signal whose duty cycle represents a transmission frequency to a d.c. tuning voltage, control circuit means for furnishing signals characterizing tuning operations for respective transmission frequencies; d.c. voltage storage means connected to said circuit output; switch means operable for connecting the signal converter means to said voltage storage means for the duration of a tuning operation characterizing signal furnished by said control circuit means for storage of the instantaneous d.c. level of the d.c. tuning voltage by said voltage storage means, and thereafter disconnecting the signal converter means from said voltage storage means so that the level of the d.c. voltage stored by said voltage storage means at the end of said tuning operation is applied to said circuit output.

3. A signal receiver according to claim 2, wherein said control circuit is a time control circuit means for furnishing a signal characterizing a respective tuning operation for a predetermined duration from the start of said respective tuning operation.

4. A signal receiver according to claim 2, including a tuning control circuit for effecting a search mode by varying the duty cycle of the tuning signal over a range representing a receiving frequency range and furnishing said tuning operation characterizing signal for the duration of the tuning operation.

5. A signal receiver according to claim 2, including buffer amplifier means connecting the voltage storage means to said circuit output.

6. A receiver according to claim 2, including buffer amplifier means having an input connected to said voltage storage means and an output connected to said circuit output, said buffer amplifier means for providing high output current in response to voltage inequality at said input and said circuit output and low output current in response to voltage equality at said input and said circuit output.

7. A receiver according to claim 6, including capacitive load means connected to said circuit output.

8. A receiver according to claim 7, wherein said capacitive load means comprises voltage variable capacitance means of a tuned circuit forming part of said input stage.

9. A receiver according to claim 2, including coincidence detection means for determining coincident presence in a television transmission frequency signal of a sync pulse and a line flyback pulse and in response to said coincidence for operating said switch means to disconnect the signal converter means from said voltage storage means.

10. A receiver according to claim 2, including AFC means for feeding an AFC signal to said voltage storage means, and means for disabling said AFC means for the period said switching means connects said signal converter means to said voltage storage means.

11. A voltage follower amplifier comprising differential amplifier stage means having an output connected to an inverting input, a non-inverting input for receiving an input voltage, said differential amplifier stage means including a pair of transistors, one transistor providing said inverting input and the other said transistor providing said non-inverting input, said pair of transistors having a common input supply circuit including a switchable constant current source means, said differential amplifier stage means for producing at said output an output current which corresponds to the difference between supply output currents of said two transistors, control circuit means for responding to the existence of a voltage difference between said input voltage and an output voltage produced by said output current to switch said current source from a low supply current mode to a high supply current mode.

12. Voltage follower amplifier according to claim 11, wherein said constant current source includes two resistors in series and at least one switch means actuated by said control circuit for short circuiting one of said resistors.

13. Voltage follower amplifier according to claim 12, wherein said one resistor has a large resistance compared with that of the other resistor.

14. Voltage follower amplifier according to claim 12, wherein the differential amplifier stage means is a common emitter differential amplifier stage, wherein said switchable constant current source includes a transistor having a collector-emitter path in the common emitter circuit of the differential amplifier stage, said two resistors connected in the emitter circuit of said transistor.

15. Voltage follower amplifier according to claim 14, wherein said transistor is an output transistor of a current mirror having an input transistor connected to a constant current source.

16. Voltage follower amplifier according to claim 15, wherein said input transistor of said input transistor includes an emitter resistor which has a resistance value intermediate those of said two transistors.

17. Voltage follower amplifier according to claim 12, wherein said control circuit means includes a second differential amplifier stage means which is complementary to and is connected to receive the same control voltages as said first differential amplifier stage means, said second differential amplifier stage means having an input supply circuit including a second constant current source means, said second differential amplifier stage means having an output for controlling collector-emitter path of which a transistor switch connected in parallel with the short-circuitable resistor.

18. Voltage follower amplifier according to claim 17, wherein said second constant current source means for providing a constant current so dimensioned that the voltage drop produced by half of the constant current at a load resistor of a transistor of said second differential amplifier stage is insufficient to open said transistor switch and that the voltage drop produced by the entire constant current at said load resistor is sufficient to open the switch transistor.

19. Voltage follower amplifier according to claim 18, wherein the second constant current source comprises a second current mirror having an input transistor connected to receive a constant current and having an output transistor lies in the common input supply circuit of said second differential amplifier stage.

20. Voltage follower amplifier according to claim 11, wherein the output current of each transistor of the first differential amplifier stage forms the input current of a third and fourth current mirror respectively, the output of the fourth current mirror associated with the inverting input of the first differential amplifier stage connected to the input of a fifth current mirror of complementary type, and the outputs of the complementary output transistors of the third current mirror and the fifth current mirror connected together and to the output of the voltage follower amplifier.

21. A signal receiver comprising a voltage tunable input stage and tuning voltage generation means having a circuit output for supplying a d.c. tuning voltage to the input stage and including signal converter means for converting a tuning signal whose duty cycle represents a transmission frequency to a d.c. tuning voltage, control circuit means for furnishing signals characterizing tuning operations for respective transmission frequencies; d.c. voltage storage means; buffer amplifier means connecting the voltage storage means to said said circuit output; buffer amplifier means comprising differential amplifier stage means having an output connected to an inverting input, a non-inverting input connected to the voltage storage means, a pair of transistors having a common input supply circuit including a switchable constant current source means, said differential amplifier stage means for producing at said output current which corresponds to the difference between output supply currents of said two transistors, control circuit means for responding to the existence of a voltage difference between a voltage stored by said voltage storage means and an output voltage produced by said output current to switch said current source from a low supply current made to a high supply current mode; and switch means operable for connecting the signal converter means to said voltage storage means for the duration of a tuning operation characterizing signal furnished by said control circuit means and thereafter disconnecting the signal converter means from said voltage storage means.

22. A signal receiver according to claim 21, wherein the differential amplifier stage means is a common emitter differential amplifier stage, wherein said switchable constant current source includes a further transistor having a collector-emitter path in the common emitter circuit of the diffewrential amplifier stage, said two resistors connected in the emitter circuit of said transistor.

23. A signal receiver according to claim 22, wherein said further transistor is an output transistor of a current mirror having an input transistor connected to a constant current source.

* * * * *

UNITED STATES PATENT OFFICE
CERTIFICATE OF CORRECTION

Patent No. 4,511,923    Dated Apr. 16, 1985

Inventor(s) Laslo Götz

It is certified that error appears in the above-identified patent and that said Letters Patent are hereby corrected as shown below:

On the front page, change

(73) Assignee:    Texas Instruments Incorporated, Dallas, Texas to

(73) Assignee:    Texas Instruments Deutschland G,m.b.H., Freising, Germany

*Signed and Sealed this*

*Twenty-fourth* Day of *September 1985*

[SEAL]

Attest:

Attesting Officer

DONALD J. QUIGG

*Commissioner of Patents and Trademarks—Designate*